(12) United States Patent
Jeong et al.

(10) Patent No.: US 12,062,729 B2
(45) Date of Patent: Aug. 13, 2024

(54) SEE-THROUGH THIN FILM SOLAR CELL MODULE AND METHOD OF MANUFACTURING THE SAME

(71) Applicant: KOREA INSTITUTE OF SCIENCE AND TECHNOLOGY, Seoul (KR)

(72) Inventors: Jeung-hyun Jeong, Seoul (KR); Gee Yeong Kim, Seoul (KR); Hyeonggeun Yu, Seoul (KR); Won Mok Kim, Seoul (KR); Hyunjae Lee, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 399 days.

(21) Appl. No.: 17/535,577

(22) Filed: Nov. 25, 2021

(65) Prior Publication Data

US 2022/0173262 A1 Jun. 2, 2022

(30) Foreign Application Priority Data

Nov. 30, 2020 (KR) .................. 10-2020-0164370

(51) Int. Cl.
*H01L 31/032* (2006.01)
*H01L 31/0224* (2006.01)
*H01L 31/0463* (2014.01)
*H01L 31/18* (2006.01)

(52) U.S. Cl.
CPC .. *H01L 31/0322* (2013.01); *H01L 31/022441* (2013.01); *H01L 31/0463* (2014.12); *H01L 31/1884* (2013.01)

(58) Field of Classification Search
None
See application file for complete search history.

(56) References Cited

U.S. PATENT DOCUMENTS

| 9,941,423 | B2 | 4/2018 | Jeong et al. | |
|---|---|---|---|---|
| 2012/0180869 | A1 | 7/2012 | Jee et al. | |
| 2014/0030843 | A1* | 1/2014 | Ahmed | H01L 31/0326 257/E31.004 |
| 2016/0268454 | A1* | 9/2016 | Gwon | H01L 31/035281 |
| 2019/0035953 | A1* | 1/2019 | Reinhard | H01L 31/035272 |
| 2019/0341510 | A1* | 11/2019 | Kim | H01L 31/022466 |
| 2020/0075785 | A1* | 3/2020 | Yun | H01L 31/022483 |
| 2022/0037553 | A1* | 2/2022 | Algasinger | H01L 31/0468 |

FOREIGN PATENT DOCUMENTS

| KR | 10-2011-0035771 A | 4/2011 |
|---|---|---|
| KR | 10-2016-0050929 A | 5/2016 |

OTHER PUBLICATIONS

Korean Office Action for KR Application No. 10-2020-0164370 mailed on Jul. 20, 2022 citing the above reference(s).

* cited by examiner

*Primary Examiner* — Evren Seven
(74) *Attorney, Agent, or Firm* — CANTOR COLBURN LLP

(57) ABSTRACT

Provided is a see-through thin film solar cell module including a transparent substrate, a first back electrode deposited on a first surface of the transparent substrate, a second back electrode deposited on the first back electrode and including a $MoSe_2$ layer, an absorber layer deposited on the second back electrode and including selenium (Se) or sulfur (S), and a laser scribing pattern formed by partially removing the absorber layer.

8 Claims, 13 Drawing Sheets

SEE-THROUGH THIN FILM SOLAR CELL MODULE AND METHOD OF MANUFACTURING THE SAME

CROSS-REFERENCE TO RELATED PATENT APPLICATION

This application claims the benefit of Korean Patent Application No. 10-2020-0164370, filed on Nov. 30, 2020, in the Korean Intellectual Property Office, the disclosure of which is incorporated herein in its entirety by reference.

BACKGROUND OF THE INVENTION

1. Field of the Invention

The present invention relates to a thin film solar cell module and a method of manufacturing the same and, more particularly, to a see-through chalcogenide thin film solar cell module having high transmittance, and a method of manufacturing the same.

2. Description of the Related Art

Chalcogenide thin film solar cells have excellent photovoltaic performance close to that of crystalline silicon solar cells, e.g., a photovoltaic efficiency of 23.4% in a $Cu(In,Ga)(Se,S)_2$ absorber layer. In addition, based on light weights, the chalcogenide thin film solar cells attract much attention as a next-generation energy technology applicable to various environments. Particularly, when transmittance is given to the chalcogenide thin film solar cells having high-efficiency photovoltaic performance, the growth of high value-added solar power markets using windows of buildings, sunroofs of vehicles, etc. may be promoted.

Research on commercialization of transparent solar cells has been focused on dye-sensitized solar cells, organic solar cells, and amorphous silicon (a-Si) solar cells. To make the solar cells transparent, a method of transmitting visible light by controlling a band gap of an absorber layer, a method of lowering an absorbance by making an absorber layer ultra-thin, or the like has been used.

However, the highest photovoltaic efficiency of those solar cells is low, e.g., about 10% to about 15%, and thus a technological level of the transparent solar cells does not reach an efficiency of 8% (at an average visible light transmittance of 30%). In addition, the dye-sensitized solar cells or the organic solar cells lack constituent material stability and thus are not suitable for solar cell power plants which require long-term use.

Meanwhile, in addition to the ultra-thin film solar cells, a technology for manufacturing see-through solar cells by forming apertures in a high-efficiency chalcogenide thin film has been reported. This technology gives transmittance by performing mechanical scribing to form a plurality of apertures in a produced solar cell thin film.

However, because the existing see-through chalcogenide thin film solar cell technology uses mechanical scribing, a see-through region has a very large line width noticeable by the naked eye and an aperture pattern is not precise, thereby greatly reducing aesthetic properties of products. To implement aesthetic see-through solar cells, the aperture pattern needs to be unnoticeable by the naked eye and thus should be formed to be less than or equal to a size noticeable by the naked eye from a certain distance (e.g., 100 um). Therefore, to solve the above problem, laser scribing may be adopted to manufacture a thin film solar cell module. Laser scribing is a process of selectively removing a desired region for a scribing pattern by locally irradiating a laser beam onto and heating the region.

However, when laser scribing is performed to remove a part of an absorber layer deposited on a back electrode, an area or shape of a pattern formed due to laser scribing may significantly differ from that of a designed pattern or a residue of the absorber layer may be left on the back electrode. FIGS. 16 to 19 are cross-sectional views showing examples of general problems of laser scribing.

Referring to FIG. 16, a general see-through thin film solar cell includes a transparent substrate 10 including a first surface, and a second surface opposite to the first surface. The see-through thin film solar cell has a structure in which a first back electrode 22, an absorber layer 40, and a transparent electrode layer 60 are sequentially laminated on the first surface of the transparent substrate 10. A thin film solar cell generally uses a metal such as molybdenum (Mo) for the first back electrode 22, but a see-through thin film solar cell implemented through laser processing uses a transparent conductor such as indium tin oxide (ITO) to improve laser processability and ensure transparency. A scribing process for removing a part of the absorber layer 40 may be performed to manufacture a see-through thin film solar cell module, and patterns P2, P3, and P4 to be described below may be formed due to the removal of the absorber layer 40. The scribing process may be performed by irradiating a laser beam L onto the second surface of the transparent substrate 10 as illustrated in FIG. 16. When the laser beam L is incident as illustrated in FIG. 16, an interfacial region H1 between the first back electrode 22 and the absorber layer 40 is intensively heated and all of upper layers including the absorber layer 40 (e.g., a part indicated by a dashed line) are removed to form a laser scribing pattern. In this case, due to a high interfacial bonding strength between a transparent conductor such as ITO used for the first back electrode 22 and a chalcogenide such as copper indium gallium selenide (CIGS) used for the absorber layer 40, at above a threshold laser energy for interfacial delamination, as illustrated in FIG. 17, damage D to the first back electrode 22 may be caused by heat in the middle of the pattern where the laser intensity is high or a residue R of the absorber layer 40 may be left at the edge of the pattern where the laser intensity is low. The pattern P4 is a see-through pattern formed to ensure visibility of the solar cell, and irregular shape of the pattern P4 induced by nonuniform laser heating increases scattering and absorption of light to reduce transmittance performance of the solar cell.

As a solution to the above-described problem, as illustrated in FIG. 18, a second back electrode 24B may be adopted on the first back electrode 22. For example, a Mo layer having a thickness of 10 nm to 1,000 nm may be deposited as the second back electrode 24B on the first back electrode 22 made of a transparent conductor. In this case, a laser beam L incident on the second surface of the transparent substrate 10 is mostly absorbed into an interfacial region H2 between the first and second back electrodes 22 and 24B, and all of the second back electrode 24B made of Mo and upper layers including the absorber layer 40 (e.g., a part indicated by a dashed line) are removed due to melting and expansion of the interfacial region H2 to form a laser scribing pattern. However, because the Mo layer serving as the second back electrode 24B has a certain thickness and a high thermal conductivity, heat energy of the incident laser beam L is not concentrated on the interfacial region H2 and dissipates through the Mo layer. As such, heat energy of the incident laser beam L may not be easily concentrated on the interfacial region H2 and thus a pattern formed by the laser beam may greatly differ from a designed pattern in shape or size to cause excessively irregular processing (see reference symbol I in FIG. 19). When laser scribing is performed by increasing power of the incident laser beam L to solve the above-described problem, not only the absorber layer 40 may be removed but also at least a part of the first and second back electrodes 22 and 24B may be damaged (see reference symbol D in FIG. 19). In this case, shunting between cells may occur, or irregularity may be caused in subsequent thin film deposition, and visibility may deteriorate in the case of the pattern P4.

SUMMARY OF THE INVENTION

The present invention provides a see-through thin film solar cell module having transmittance and high-efficiency photovoltaic performance and capable of causing no residue of an absorber layer and no damage to a back electrode in a laser scribing process, and a method of manufacturing the same. However, the scope of the present invention is not limited thereto.

According to an aspect of the present invention, there is provided a see-through thin film solar cell module.

The see-through thin film solar cell module may include a transparent substrate, a first back electrode deposited on a first surface of the transparent substrate, a second back electrode deposited on the first back electrode and including a $Mo(Se_xS_{1-x})_2$ layer, an absorber layer deposited on the second back electrode and including selenium (Se) or sulfur (S), and a laser scribing pattern formed by partially removing the absorber layer.

The second back electrode may further include a molybdenum (Mo) layer with a thickness less than 2 nm remaining under the $Mo(Se_xS_{1-x})_2$ layer.

The second back electrode may have a thickness ranging from 2 nm to 5 nm.

The $Mo(Se_xS_{1-x})_2$ layer may exist under a bottom surface of the laser scribing pattern.

The laser scribing pattern may include, on at least a part of a photovoltaic region, a see-through array pattern formed by removing the absorber layer and the transparent electrode layer.

The $Mo(Se_xS_{1-x})_2$ layer may have a lamellar structure.

The $Mo(Se_xS_{1-x})_2$ layer may be formed due to reaction between the Mo layer and selenium (Se) and sulfur (S), or using a deposition method.

The first back electrode may include a material selected from among transparent conductive oxide (TCO) including at least one of oxide of indium, oxide of zinc, and oxide of tin, a multilayer transparent electrode including TCO, a metal film or a nanowire layer, and TCO, and a carbon-based transparent electrode including at least one of graphene and carbon nanotubes.

The transparent electrode layer may include In-doped SnOx, F-doped SnOx, (H, Mo, W)-doped InOx, Al-doped ZnOx, In-doped ZnOx, Ga-doped ZnOx, B-doped ZnOx, Ag nanowires, graphene, carbon nanotubes, Ag, MgAg alloy, Au, or a metal oxide/thin metal/metal oxide (OMO) electrode material.

According to an aspect of the present invention, there is provided a method of manufacturing a see-through thin film solar cell module.

The method may include depositing a transparent first back electrode on a first surface of a transparent substrate, depositing a molybdenum (Mo) layer as a second preliminary back electrode on the first back electrode, performing a first laser scribing process to peel off a double layer of the first back electrode and the second preliminary back electrode, depositing an absorber layer including selenium (Se) or sulfur (S), on the second back electrode and forming a second back electrode by transforming the Mo layer entirely into a $Mo(Se_xS_{1-x})_2$ layer or into a $Mo(Se_xS_{1-x})_2$ layer having Mo remaining thereunder with a thickness less than 2 nm due to reaction between the Mo layer and Se or S during a selenization or sulfurization process performed to deposit the absorber layer, performing a second laser scribing process to peel off the absorber layer, depositing a transparent electrode layer on the absorber layer, performing a third laser scribing process to peel off the transparent electrode layer, and performing a fourth laser scribing process to form a fourth laser scribing pattern serving as a see-through array pattern, by removing partial regions of the absorber layer and the transparent electrode layer deposited on a photovoltaic region.

The method may include depositing a transparent first back electrode on a first surface of a transparent substrate, depositing a second back electrode including a $Mo(Se_xS_{1-x})_2$ layer, on the first back electrode, performing a first laser scribing process to peel off a double layer of the first back electrode and the second back electrode, depositing an absorber layer including selenium (Se) or sulfur (S), on the second back electrode, performing a second laser scribing process to peel off the absorber layer, depositing a transparent electrode layer on the absorber layer, performing a third laser scribing process to peel off the transparent electrode layer, and performing a fourth laser scribing process to form a fourth laser scribing pattern serving as a see-through array pattern, by removing partial regions of the absorber layer and the transparent electrode layer deposited on a photovoltaic region.

The second laser scribing process may be performed to remove the absorber layer on the $Mo(Se_xS_{1-x})_2$ layer and leave the $Mo(Se_xS_{1-x})_2$ layer.

The third and fourth laser scribing processes may be performed to remove the absorber layer and the transparent electrode layer on the $Mo(Se_xS_{1-x})_2$ layer and leave the $Mo(Se_xS_{1-x})_2$ layer.

The second preliminary back electrode may be deposited to a thickness ranging from 0.1 nm to 5 nm.

The second back electrode may be formed to a thickness ranging from 1 nm to 5 nm.

The method may further include depositing at least one layer from among a buffer layer and a high resistive window layer on the absorber layer, and the at least one layer may be removed together with the absorber layer when the second laser scribing process is performed.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art.

Figure 1:
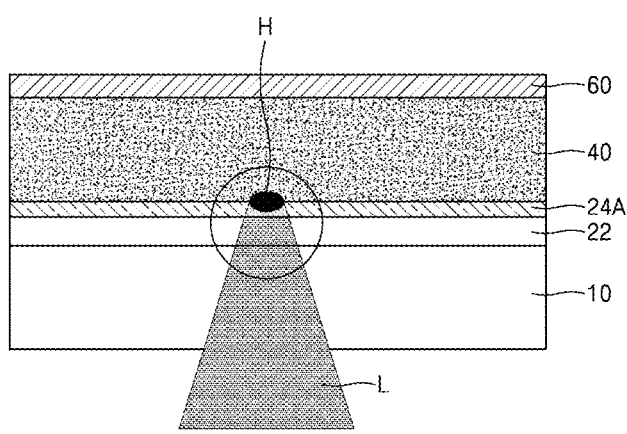
FIGS. 1 and 2 are cross-sectional views showing a laser scribing process of a see-through thin film solar cell, according to an embodiment of the present invention.
Figure 2:
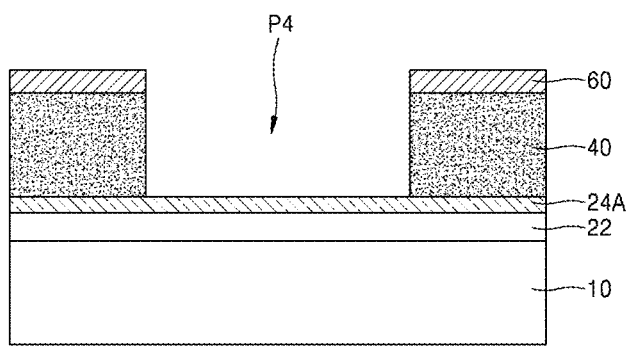

FIGS. 1 and 2 are cross-sectional views showing a structure of a see-through thin film solar cell 100 and a process of forming a fourth laser scribing pattern P4, according to an embodiment of the present invention.

Referring to FIG. 1, the see-through thin film solar cell 100 before forming the fourth laser scribing pattern P4 has a structure in which a first back electrode 22, a second back electrode 24A, an absorber layer 40, and a transparent electrode layer 60 are sequentially laminated on a first surface of a transparent substrate 10.

The second back electrode 24A may include a $Mo(Se_xS_{1-x})_2$ layer, or further include molybdenum (Mo) with a thickness less than 2 nm remaining under the $Mo(Se_xS_{1-x})_2$ layer. The second back electrode 24A may have a thickness ranging from 1 nm to 5 nm.

By irradiating a laser beam L onto a second surface of the transparent substrate 10 to perform patterning, a part of the absorber layer 30 and the transparent electrode layer 60 on the second back electrode 24A is selectively removed to form the fourth laser scribing pattern P4 as illustrated in FIG. 2.

In the see-through thin film solar cell 100 according to an embodiment of the present invention, the second back electrode 24A may include only a $Mo(Se_xS_{1-x})_2$ layer without additionally including Mo. Alternatively, even when the second back electrode 24A has a double-layer structure of $Mo(Se_xS_{1-x})_2$/Mo, the Mo layer under the $Mo(Se_xS_{1-x})_2$ layer is provided to a very small thickness less than 2 nm. Therefore, heat dissipation by Mo which is caused when a Mo layer having a thickness greater than or equal to 10 nm is used as a second back electrode does not occur such that the incident laser beam L is sufficiently concentrated on an interface between the absorber layer 40 and the second back electrode 24A. Accordingly, the absorber layer 40 is selectively removed from a region where the laser beam L is sufficiently concentrated, and a problem such as a residue of the absorber layer 40 or damage to the second back electrode 24A is not caused.

After the absorber layer 40 and the transparent electrode layer 60 are selectively removed by performing fourth laser scribing as illustrated in FIG. 2, the second back electrode 24A is not removed but remains under a bottom surface of the fourth laser scribing pattern P4. This principle is equally applied to a third laser scribing pattern P3 to be described below, and to a second laser scribing pattern P2 to be formed before the transparent electrode layer 60 is deposited on the absorber layer 40.

$Mo(Se_xS_{1-x})_2$ included in the second back electrode 24A may have a lamellar structure and, in this case, a bonding strength with the absorber layer 40 thereon may be low to facilitate selective removal of the absorber layer 40.

For example, $Mo(Se_xS_{1-x})_2$ included in the second back electrode 24A may be formed due to reaction between Mo and selenium (Se) or sulfur (S) during a selenization or sulfurization process performed to deposit the absorber layer 40. As another example, $Mo(Se_xS_{1-x})_2$ may be deposited using various deposition methods such as physical vapor deposition (PVD), chemical vapor deposition (CVD), and atomic layer deposition (ALD). The above-mentioned deposition methods are already known and thus a detailed description thereof is not provided herein.

Figure 3:
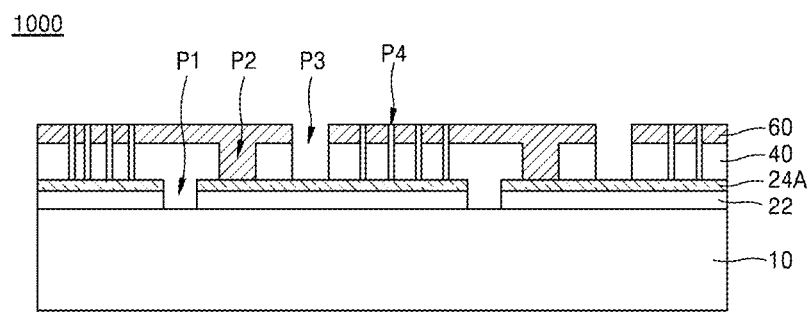
FIGS. 3 and 4 are cross-sectional and top views showing the structure of a see-through thin film solar cell module, according to an embodiment of the present invention.
Figure 4:
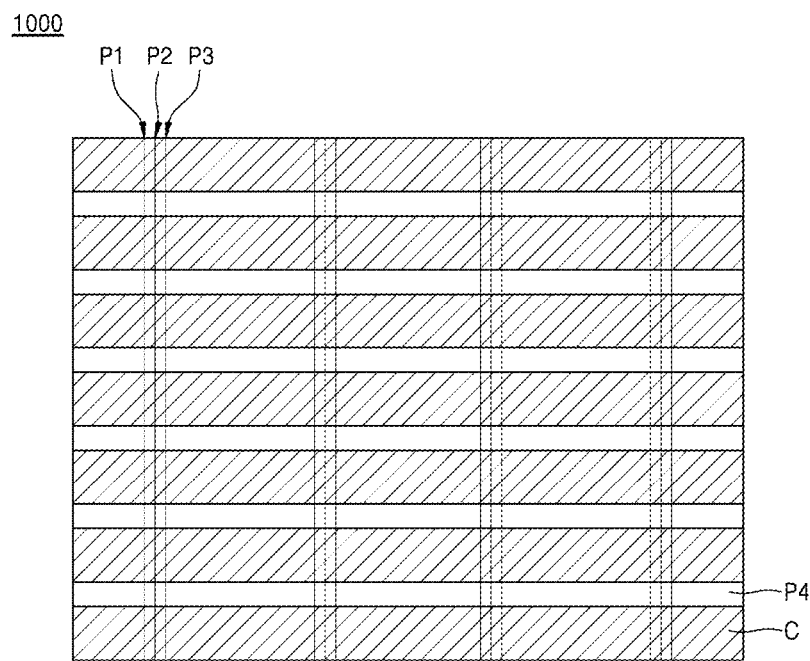

FIGS. 3 and 4 are cross-sectional and top views showing a structure of a see-through thin film solar cell module 1000 according to an embodiment of the present invention.

Referring to FIGS. 3 and 4, the see-through thin film solar cell module 1000 according to an embodiment of the present invention may include a structure in which the first back electrode 22, the second back electrode 24A, the absorber layer 40, and the transparent electrode layer 60 are sequentially laminated on the first surface of the transparent substrate 10. The see-through thin film solar cell module 1000 includes a first laser scribing pattern P1 formed by removing at least a part of the first and second back electrodes 22 and 24A, a second laser scribing pattern P2 spaced apart from the first laser scribing pattern P1 by a certain distance and formed by removing at least a part of the absorber layer 40, and a third laser scribing pattern P3 spaced apart from the second laser scribing pattern P2 by a certain distance and formed by removing at least a part of the absorber layer 40 and the transparent electrode layer 60.

The see-through thin film solar cell module 1000 further includes a see-through array P4 formed by removing the absorber layer 40 and the transparent electrode layer 60. The see-through array P4 is formed considering a photovoltaic region C, and includes a pattern of holes or lines. Herein, a diameter of the holes or a width of the lines may be less than or equal to 200 μm. Specifically, the diameter of the holes or the width of the lines may be less than or equal to 100 μm.

A method of manufacturing the see-through thin film solar cell module 1000, according to an embodiment of the present invention, will now be described in detail with reference to FIGS. 5 to 10.

Figure 5:
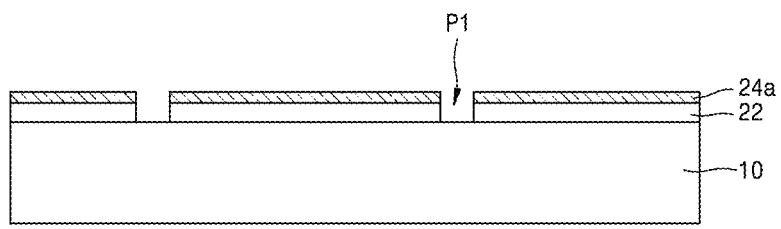
FIGS. 5 to 10 are cross-sectional views for sequentially describing processes of a method of manufacturing a see-through thin film solar cell module, according to an embodiment of the present invention.

Initially, referring to FIG. 5, a transparent first back electrode 22 may be deposited on the first surface of the transparent substrate 10. The transparent substrate 10 may use various materials, e.g., glass and polymer, as long as a laser beam is transmittable therethrough to use laser processing.

The first back electrode 22 is deposited to a thickness ranging from 50 nm to 1,000 nm. The first back electrode 22 may include a material selected from among transparent conductive oxide (TCO) including at least one of oxide of indium, oxide of zinc, and oxide of tin, a multilayer transparent electrode including TCO, a metal film or a nanowire layer, and TCO, and a carbon-based transparent electrode including at least one of graphene and carbon nanotubes. The first back electrode 22 may be made of a material having an absorbance less than or equal to 20% in a visible or near-infrared band and having a specific resistance less than or equal to 1E-2 Ωcm.

A Mo layer is deposited as a second preliminary back electrode 24a on the first back electrode 22. Herein, the second preliminary back electrode 24a refers to a layer, the entirety or a part of which reacts with Se or S in a subsequent selenization or sulfurization process and is transformed into a $Mo(Se_xS_{1-x})_2$ layer. The entirety or a part of the Mo layer may be transformed into a $Mo(Se_xS_{1-x})_2$ layer. Considering that non-transformed residual Mo should have a thickness less than 2 nm, the deposited Mo layer may have a thickness ranging from 0.1 nm to 5 nm and, more specifically, a thickness ranging from 0.5 nm to 5 nm.

Thereafter, the first laser scribing pattern P1 is formed by performing first laser scribing to peel off a double layer of the first back electrode 22 and the second preliminary back electrode 24a.

Figure 6:
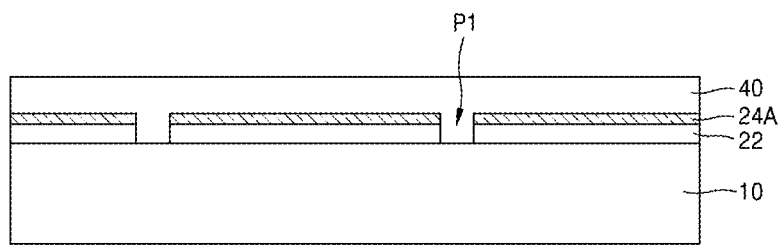

Then, the absorber layer 40 including Se may be deposited on the second preliminary back electrode 24a. The absorber layer 40 is made of a material including at least one of copper (Cu) and silver (Ag), at least one of indium (In), gallium (Ga), aluminum (Al), zinc (Zn), and tin (Sn), and selenium (Se) or sulfur (S). Due to reaction with Se or S used for selenization or sulfurization performed to deposit the absorber layer 40, the second preliminary back electrode 24a is transformed into the second back electrode 24A including a $Mo(Se_xS_{1-x})_2$ layer as illustrated in FIG. 6.

Figure 16:
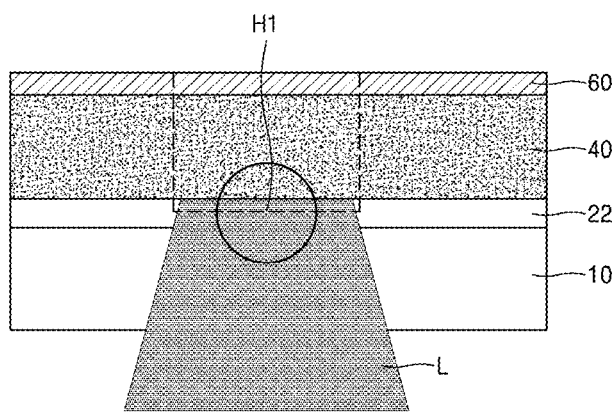
FIGS. 16 to 19 are cross-sectional views showing laser scribing processes of see-through thin film solar cells, according to comparative examples of the present invention.
Figure 17:
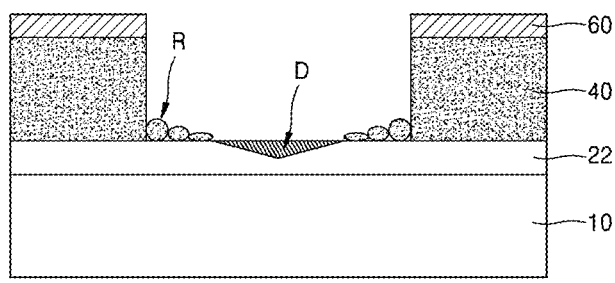
Figure 18:
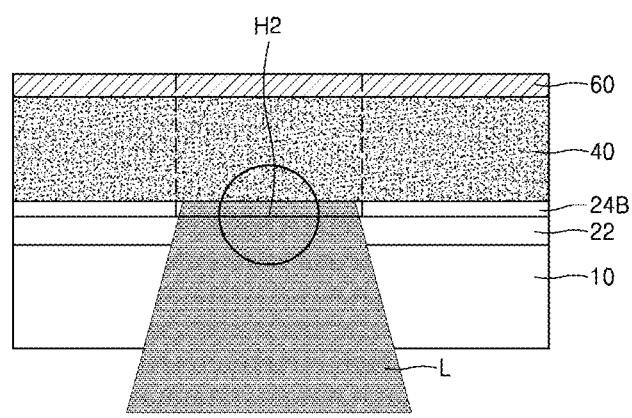
Figure 19:
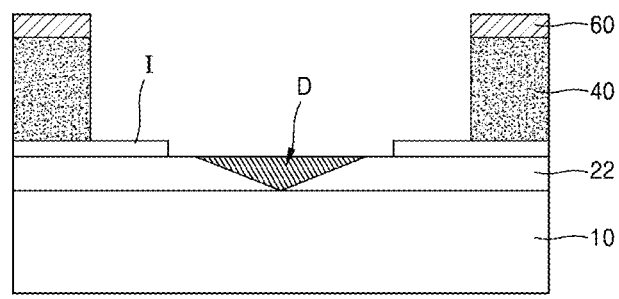

The $Mo(Se_xS_{1-x})_2$ layer may be formed between the absorber layer 40 and the first back electrode 22 to serve as a kind of releasing layer for enabling selective removal of only the absorber layer 40 in a region where a laser beam is incident in a subsequent laser scribing process. When the first back electrode 22 made of a transparent conductor such as indium tin oxide (ITO) is in direct contact with the absorber layer 40 made of a chalcogenide such as copper indium gallium selenide (CIGS) as illustrated in FIG. 16, Ga of the absorber layer 40 may react with oxygen in the transparent conductor to form gallium oxide (GaOx) at an interface therebetween. GaOx formed at the interface may increase a bonding strength between the first back electrode 22 and the absorber layer 40, and the increased bonding strength may hinder the absorber layer 40 from being neatly peeled off and removed from the first back electrode 22 in laser scribing.

On the other hand, the $Mo(Se_xS_{1-x})_2$ layer having a lamellar structure does not have a high bonding strength with the absorber layer 40 thereon. Therefore, when the $Mo(Se_xS_{1-x})_2$ layer is present between the first back electrode 22 and the absorber layer 40 as in an embodiment of the present invention, a contact area between the first back electrode 22 and the absorber layer 40 decreases and an area of the $Mo(Se_xS_{1-x})_2$ layer having a low bonding strength increases to facilitate removal of the absorber layer 40. The $Mo(Se_xS_{1-x})_2$ layer may be discontinuously formed at partial regions of the interface between the first back electrode 22 and the absorber layer 40, or exist as one continuous layer. Depending on the area of the $Mo(Se_xS_{1-x})_2$ layer at the interface, laser energy required to remove the absorber layer 40 may be properly adjusted.

Meanwhile, when the Mo layer serving as the second preliminary back electrode 24a is selenized or sulfurized, only an upper part of the Mo layer in contact with the absorber layer 40 may be transformed and a lower part thereof may be maintained in the metal state. In this case, considering transmittance, non-selenized or non-sulfurized residual Mo is controlled to a thickness less than 2 nm. A reduction in transmittance may be caused when the thickness is greater than 2 nm and, in this case, visibility through the pattern P4 to be formed below to transmit light may deteriorate. After deposition of the absorber layer 40 is completed, the second back electrode 24A may have a thickness ranging from 1 nm to 5 nm.

According to a modified embodiment, the second back electrode 24A may be formed by directly depositing the $Mo(Se_xS_{1-x})_2$ layer on the first back electrode 22 before depositing the absorber layer 40.

The $Mo(Se_xS_{1-x})_2$ layer may be deposited using various deposition methods such as PVD, CVD, and ALD. Considering that an interplanar spacing of a unit cell is 12.9 Å, the deposited $MoSe_2$ layer may have a thickness of 1 nm to 5 nm and, more specifically, a thickness of 2 nm to 5 nm. After the $Mo(Se_xS_{1-x})_2$ layer is deposited, the absorber layer 40 including Se or S is deposited.

Figure 7:
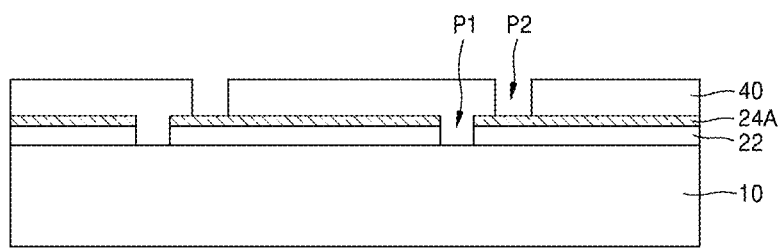

Then, referring to FIG. 7, the second laser scribing pattern P2 is formed by performing second laser scribing by irradiating a laser beam onto the second surface of the transparent substrate 10 to peel off the absorber layer 40. In this case, the second laser scribing process is performed to remove only the absorber layer 40 on the $Mo(Se_xS_{1-x})_2$ layer and leave the $Mo(Se_xS_{1-x})_2$ layer.

Meanwhile, although not shown in the drawings, at least one layer from among a buffer layer and a high resistive window layer may be further deposited on the absorber layer 40, and the at least one layer may be removed together with the absorber layer 40 when second laser scribing is performed. The buffer layer includes, for example, CdS, Zn(O, S), Sn-doped ZnOx, Ti-doped ZnOx, i-ZnOx, Mg-doped ZnOx, or (Mg,Al)-doped ZnOx. The type and composition of the buffer layer are selected based on the type of the absorber layer 40. To control a band gap, two or more buffer layers may be deposited.

Figure 8:
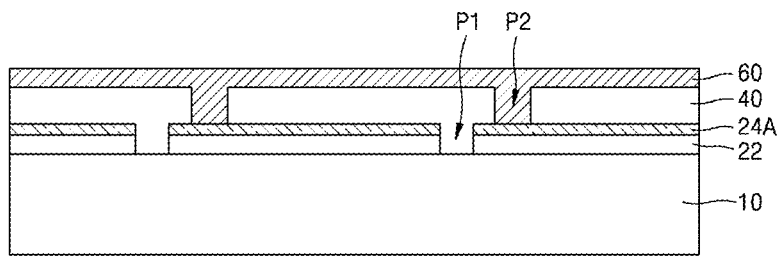

Referring to FIG. 8, the transparent electrode layer 60 may be deposited on the absorber layer 40. The transparent electrode layer 60 may include F-doped SnOx, (H, Mo, W)-doped InOx, Al-doped ZnOx, In-doped ZnOx, Ga-doped ZnOx, B-doped ZnOx, Ag nanowires, graphene, carbon nanotubes, Ag, Mg:Ag alloy, Au, or a metal oxide/thin metal/metal oxide (OMO) electrode material.

Figure 9:
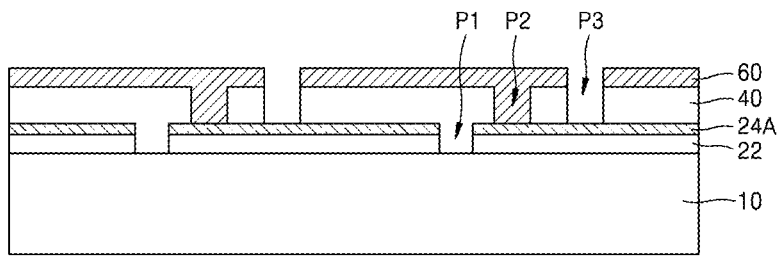

Referring to FIG. 9, the third laser scribing pattern P3 is formed by performing third laser scribing by irradiating a laser beam onto the second surface of the transparent substrate 10 to peel off the absorber layer 40 and the transparent electrode layer 60. In this case, the third laser scribing process is performed to remove only the absorber layer 40 on the $Mo(Se_xS_{1-x})_2$ layer and leave the $Mo(Se_xS_{1-x})_2$ layer.

Figure 10:
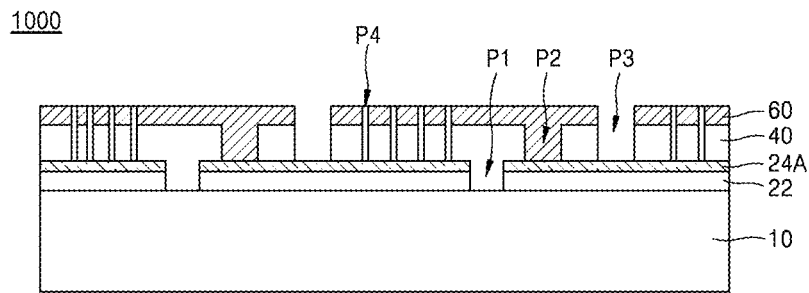

Referring to FIG. 10, after third laser scribing is performed, fourth laser scribing is performed to form a see-through array pattern for ensuring visibility. Fourth laser scribing is performed to form the see-through array pattern, i.e., the fourth laser scribing pattern P4, by removing partial regions of the absorber layer 40 and the transparent electrode layer 60 deposited on a photovoltaic region by irradiating a laser beam onto the second surface of the transparent substrate 10. In this case, like the third laser scribing process, the fourth laser scribing process is performed to remove only the absorber layer 40 on the $Mo(Se_xS_{1-x})_2$ layer and leave the $Mo(Se_xS_{1-x})_2$ layer.

A see-through array region does not overlap with a grid (not shown). A see-through array includes a pattern of holes or lines. In this case, the see-through array is formed to the same size as the see-through pattern, and a diameter of the holes or a width of the lines is controlled to be less than or equal to 200 μm. Preferably, considering optical and aesthetic properties of thin film solar cells, the diameter of the holes or the width of the lines may be less than or equal to 100 μm.

In this case, because only a photocurrent reduction corresponding to the see-through array region is caused, photovoltage, fill factor, and deterioration problems which may occur when the see-through thin film solar cell module 1000 is implemented may be avoided.

According to a modified embodiment, the third and fourth laser scribing processes may be performed simultaneously or in reverse order.

Meanwhile, the shape of the see-through array may include a polygonal shape such as a triangular shape but is differently controlled depending on a diameter and a wavelength band of a laser beam, and the size of each pattern is controlled to be less than or equal to 200 μm (and greater than 0 μm). Herein, the size and shape of the see-through pattern may be controlled to control the size of the see-through array.

The see-through array is formed not to overlap with the first, second, and third laser scribing patterns P1, P2, and P3. Alternatively, the see-through array may overlap with the patterns P1, P2, and P3.

The see-through thin film solar cell module 1000 implemented as described above may selectively control transmittance based on the see-through array, i.e., an aperture ratio, without deteriorating photovoltage and a fill factor. In addition, because only photocurrent is reduced in proportion to an aperture area, a reduction in photovoltaic efficiency based on transmittance is small compared to an ultra-thin film solar cell module.

Test examples of the present invention will now be described. However, the following test examples are merely for promoting understanding of the present invention, and the present invention is not limited thereto.

ITO was deposited on a glass substrate and then Mo was deposited to thicknesses of 0.5 nm, 1 nm, and 2 nm through sputtering. For comparison, a sample including only ITO without Mo was also prepared. Thereafter, a transmittance test was performed on the samples.

Figure 11:
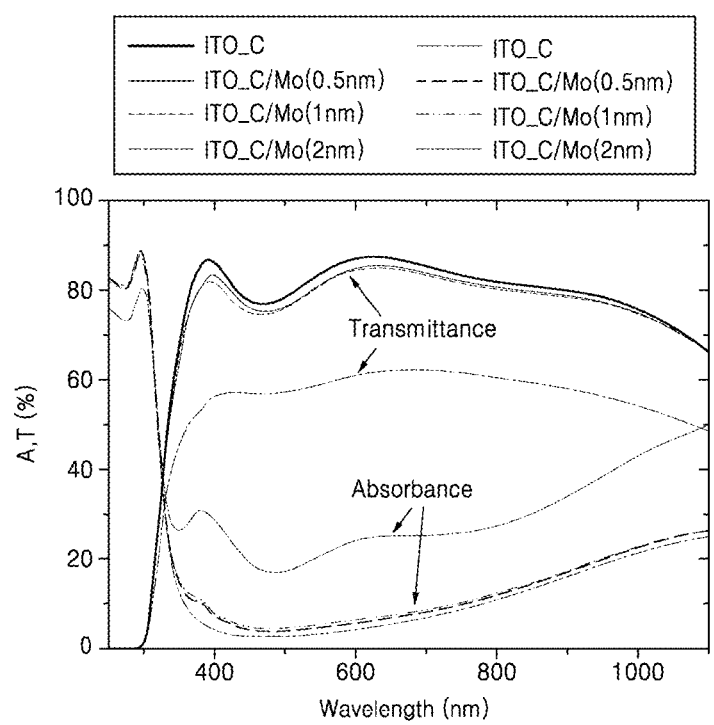
FIG. 11 shows a result of measuring transmittances and absorptions of back electrode layers (ITO/Mo) serving to see-through thin film solar cells with a Mo thickness, according to a test example of the present invention.

FIG. 11 shows a result of measuring transmittances and absorptions of back electrode layers (ITO/Mo) serving to see-through thin film solar cells with a Mo thickness, according to a test example of the present invention. Referring to FIG. 11, all of the sample including only ITO, the sample including ITO and Mo of 0.5 nm, and the sample including ITO and Mo of 1 nm show no significant differences in transmittance and absorbance. On the other hand, the sample including ITO and Mo of 2 nm shows differences in transmittance and absorbance. This result may be concluded that Mo needs to be controlled to a thickness less than 2 nm in order to ensure transmittance and the transmittance will be greatly reduced when Mo has a thickness greater than 2 nm.

To measure and compare cell efficiencies, modules were produced by depositing a CIGS absorber layer on the above back electrode samples under the same condition.

Figure 12:
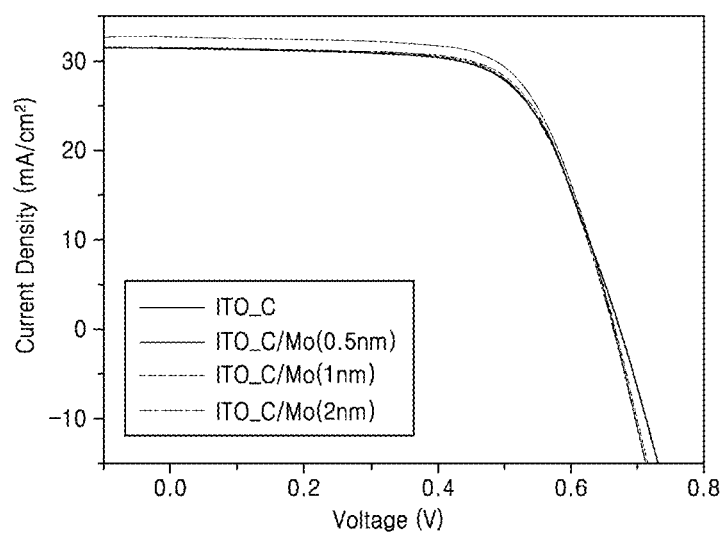
FIG. 12 shows a result of measuring photovoltaic efficiencies of see-through thin film solar cells with a thickness of Mo serving as second back electrode, according to a test example of the present invention.

FIG. 12 shows a result of measuring photovoltaic efficiencies of see-through thin film solar cells with a thickness of Mo serving as second back electrode, according to a test example of the present invention, and numerical values thereof are shown in Table 1.

TABLE 1

| K0793 | Cell Name | efficiency [%] | $V_{oc}$ [V] | $J_{sc}$ [mA/cm$^2$] | FF [%] |
|---|---|---|---|---|---|
| ITO_C | K079304_B3.TXT | 14.0 | 0.673 | 31.4 | 66.0 |
| ITO_C/Mo (0.5 nm) | K079308_B3.TXT | 14.7 | 0.666 | 32.7 | 67.6 |
| ITO_C/Mo (1 nm) | K079307_A1.TXT | 14.3 | 0.667 | 31.5 | 67.9 |
| ITO_C/Mo (2 nm) | K079306_A2.TXT | 14.1 | 0.665 | 31.6 | 67.1 |

Referring to FIG. 12 and Table 1, all of the sample including only ITO, the sample including ITO and Mo of 0.5 nm, the sample including ITO and Mo of 1 nm, and the sample including ITO and Mo of 2 nm show no significant differences in photovoltaic conversion efficiency.

Figure 13:
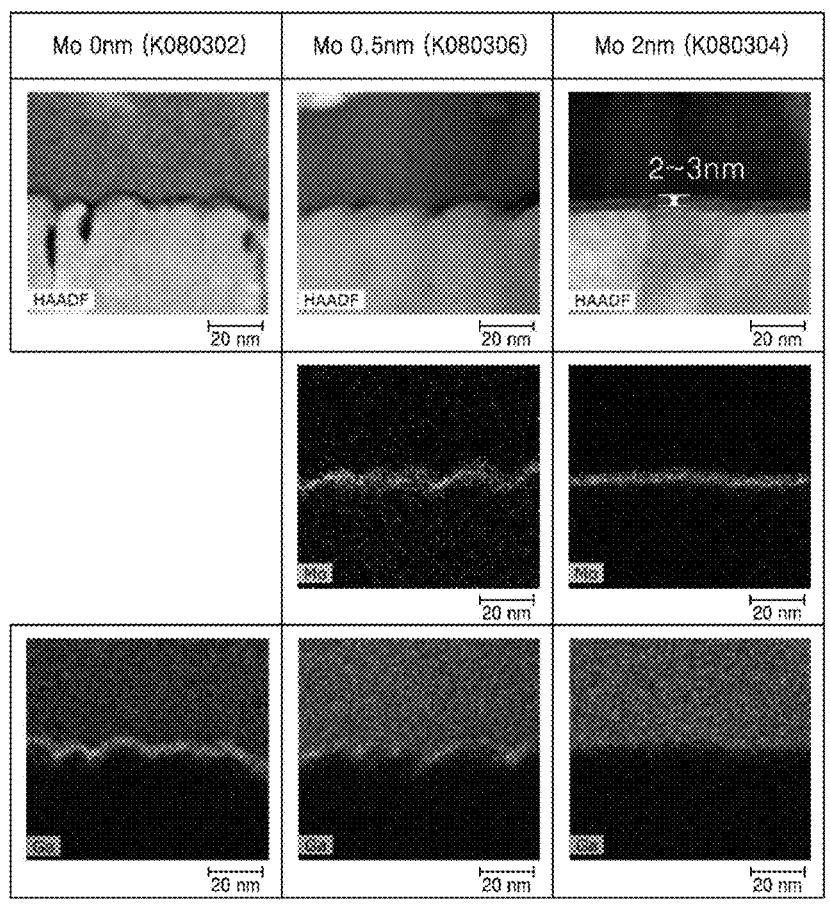
FIG. 13 shows a result of analyzing thicknesses and compositions of back electrodes of see-through thin film solar cells, according to a test example of the present invention.

FIG. 13 shows a result of analyzing compositions of Mo and Ga in a sample including only ITO, a sample including ITO and Mo of 0.5 nm, and a sample including ITO and Mo of 2 nm, under a CIGS absorber layer.

Referring to FIG. 13, the sample including only ITO shows that a GaOx layer is uniformly formed between the ITO layer and the CIGS absorber layer. On the other hand, the sample including ITO and Mo of 2 nm shows that GaOx is not formed due to a transformed $MoSe_2$ layer and that only the layer above $MoSe_2$ includes Ga. The sample including ITO and Mo of 0.5 nm shows that a GaOx layer is formed at a partial region of an interface between the ITO layer and the CIGS absorber layer. This result may be concluded that the $MoSe_2$ layer formed at the interface between the ITO layer and the CIGS absorber layer may serve as a diffusion barrier layer for suppressing reaction between Ga of the absorber layer and oxygen of the ITO layer.

FIGS. 14A to 14D show a result of analyzing, using a transmission electron microscope (TEM), microstructures of a sample including only ITO, a sample including ITO and Mo of 0.5 nm, a sample including ITO and Mo of 2 nm, and a sample including ITO and Mo of 10 nm, under a CIGS absorber layer.

Figure 14A:
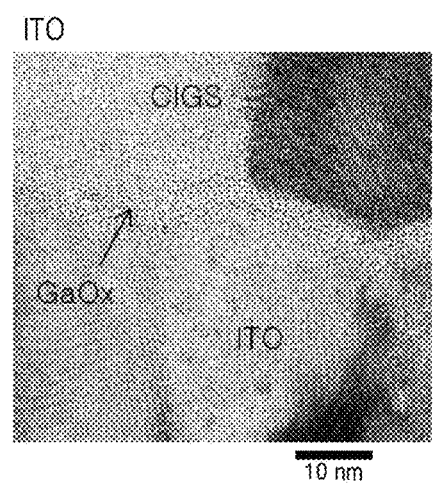
FIGS. 14A to 14D show a result of analyzing, using a transmission electron microscope (TEM), microstructures of see-through thin film solar cells based on a thickness of a second back electrode (Mo), according to a test example of the present invention.
Figure 14B:
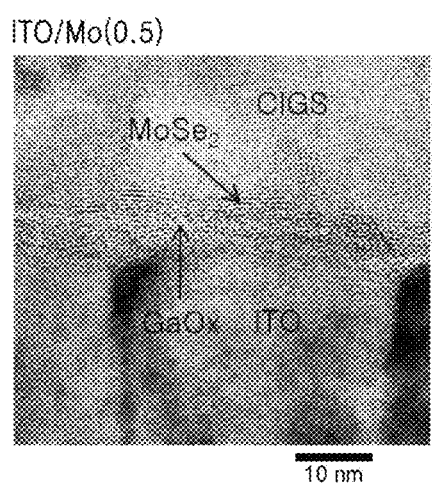
Figure 14C:
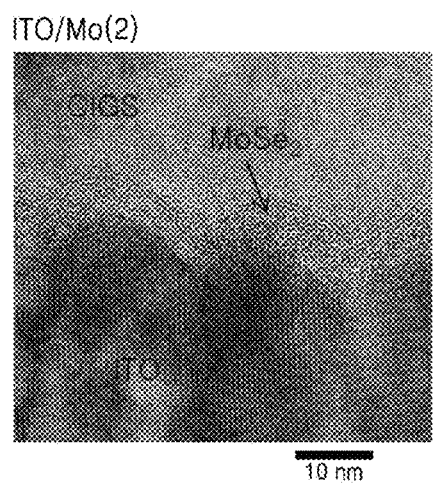
Figure 14D:
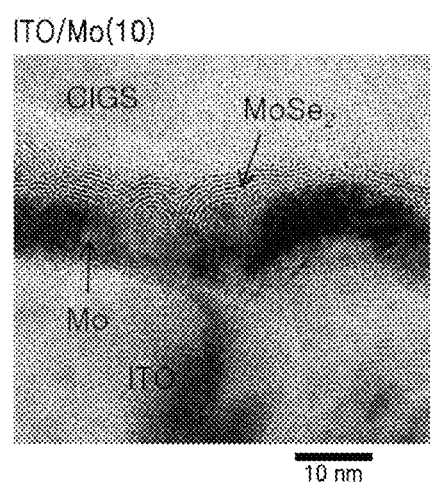

Referring to FIG. 14A, it is shown that no $MoSe_2$ layer is formed and that GaOx is formed between the ITO layer and the CIGS absorber layer. Referring to FIGS. 14B to 14D, it is shown that the entirety of deposited Mo is transformed into lamellar $MoSe_2$. This means that deposited Mo reacts with Se and is transformed into lamellar $MoSe_2$ during a selenization process of the absorber layer. Referring to FIGS. 14B and 14C, it is shown that the entirety of deposited Mo is transformed into $MoSe_2$ when Mo is deposited to a thickness less than 2 nm. It is also shown that GaOx and $MoSe_2$ coexist between the ITO layer and the CIGS layer when Mo is deposited to a thickness of 0.5 nm. However, referring to FIG. 14D, the sample including ITO and Mo of 10 nm shows that a Mo layer having a thickness of about 7 nm to about 8 nm remains under a $MoSe_2$ layer having a thickness of 2 nm to 3 nm. The residual Mo layer may disperse heat energy of an incident laser beam as described above, and thus may cause a problem in a laser patterning process. In a preliminary test, the sample including ITO and Mo of 10 nm showed poor and imprecise P2 patterning compared to the other samples.

Figure 15A:
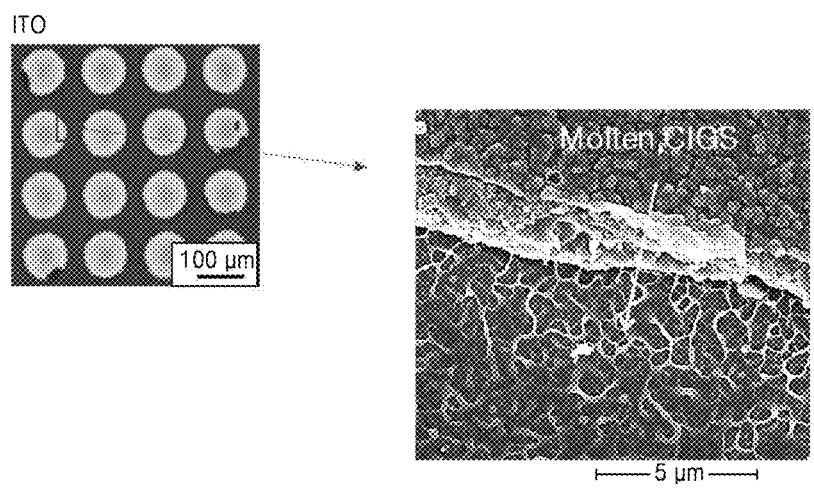
FIGS. 15A to 15C show a result of analyzing, using a scanning electron microscope (SEM), microstructures of see-through thin film solar cells based on a thickness of a second back electrode (Mo) after a see-through array is formed, according to a test example of the present invention.
Figure 15B:
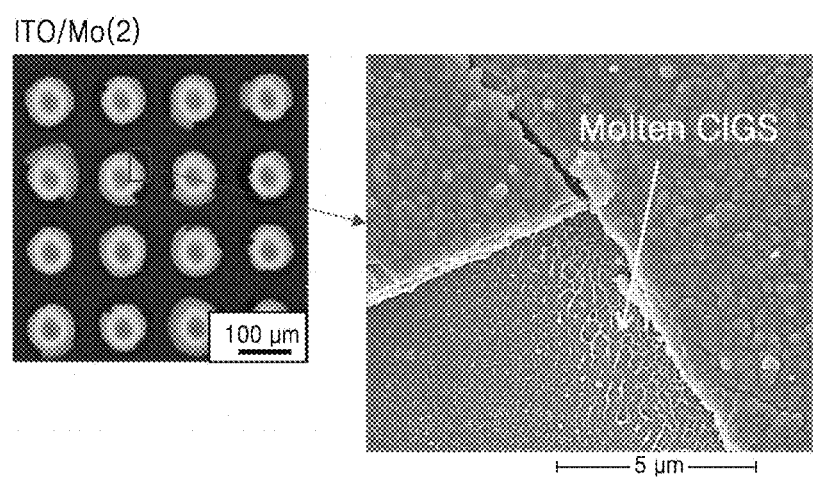
Figure 15C:
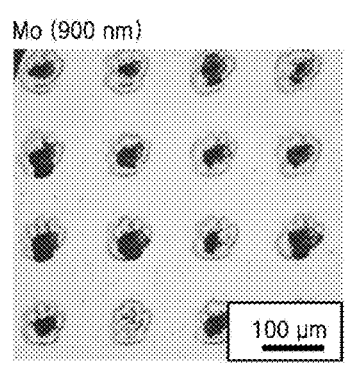

FIGS. 15A to 15C show a result of analyzing, using an optical microscope and a scanning electron microscope (SEM), surfaces of a sample including only ITO, a sample including ITO and Mo of 2 nm, and a sample including Mo only of 900 nm after the pattern P4 serving as a see-through array is formed.

Referring to FIGS. 15A to 15C, the sample including only ITO shows that much CIGS residue is left near the see-through array. On the other hand, the sample including ITO and Mo of 2 nm shows that little CIGS residue is left near the see-through array. The sample including thick Mo of 900 nm shows that the pattern P4 is hardly formed.

This result may be concluded that the $MoSe_2$ layer having a thickness of 2 nm and a lamellar structure has a low bonding strength with the CIGS absorber layer thereon and thus may serve as a releasing layer for enabling selective removal of only the CIGS absorber layer when a laser beam is incident. Without the $MoSe_2$ layer, the CIGS absorber layer is not properly removed due to lack of releasability. It may be also concluded that, when the Mo layer is deposited to a large thickness of 900 nm, the laser beam may not be easily concentrated due to heat dissipation by Mo and thus laser processing may not be properly performed.

Using the above-described method of the present invention, a see-through thin film solar cell module capable of causing no residue of an absorber layer and no damage to a back electrode in a laser scribing process and having both of transmittance and high-efficiency photovoltaic performance may be implemented. However, the scope of the present invention is not limited the above-described effect.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A method of manufacturing a see-through thin film solar cell module, the method comprising:
    depositing a transparent first back electrode on a first surface of a transparent substrate;
    depositing a molybdenum (Mo) layer as a second preliminary back electrode on the first back electrode;
    performing a first laser scribing process to peel off a double layer of the first back electrode and the second preliminary back electrode;
    depositing an absorber layer comprising selenium (Se) or sulfur (S), on the second preliminary back electrode and forming a second back electrode by transforming the Mo layer entirely into a $Mo(Se_xS_{1-x})_2$ layer or into a $Mo(Se_xS_{1-x})_2$ layer having Mo remaining thereunder with a thickness less than 2 nm due to reaction between the Mo layer and Se or S during a selenization or sulfurization process performed to deposit the absorber layer;
    performing a second laser scribing process to peel off the absorber layer;
    depositing a transparent electrode layer on the absorber layer;
    performing a third laser scribing process to peel off the absorber layer and the transparent electrode layer; and
    performing a fourth laser scribing process to form a fourth laser scribing pattern serving as a see-through array pattern, by removing partial regions of the absorber layer and the transparent electrode layer deposited on a photovoltaic region.

2. A method of manufacturing a see-through thin film solar cell module, the method comprising:
    depositing a transparent first back electrode on a first surface of a transparent substrate;
    depositing a second back electrode comprising a $Mo(Se_xS_{1-x})_2$ layer, on the first back electrode;
    performing a first laser scribing process to peel off a double layer of the first back electrode and the second back electrode;
    depositing an absorber layer comprising selenium (Se) or sulfur (S), on the second back electrode;
    performing a second laser scribing process to peel off the absorber layer;
    depositing a transparent electrode layer on the absorber layer;
    performing a third laser scribing process to peel off the absorber layer and the transparent electrode layer; and
    performing a fourth laser scribing process to form a fourth laser scribing pattern serving as a see-through array pattern, by removing partial regions of the absorber layer and the transparent electrode layer deposited on a photovoltaic region.

3. The method of claim 2, wherein the $Mo(Se_xS_{1-x})_2$ layer is deposited using physical vapor deposition (PVD), chemical vapor deposition (CVD), or atomic layer deposition (ALD).

4. The method of claim 1, wherein the second laser scribing process is performed to remove the absorber layer on the $Mo(Se_xS_{1-x})_2$ layer and leave the $Mo(Se_xS_{1-x})_2$ layer.

5. The method of claim 1, wherein the third and fourth laser scribing processes are performed to remove the absorber layer and the transparent electrode layer on the $Mo(Se_xS_{1-x})_2$ layer and leave the $Mo(Se_xS_{1-x})_2$ layer.

6. The method of claim 1, wherein the second preliminary back electrode is deposited to a thickness ranging from 0.1 nm to 5 nm.

7. The method of claim 1, wherein the second back electrode is formed to a thickness ranging from 1 nm to 5 nm.

8. The method of claim 1, further comprising depositing at least one layer from among a buffer layer and a high resistive window layer on the absorber layer,
    wherein the at least one layer is removed together with the absorber layer when the second laser scribing process is performed.

* * * * *